(12) United States Patent
Voss

(10) Patent No.: US 6,255,879 B1
(45) Date of Patent: Jul. 3, 2001

(54) DIGITAL PROGRAMMABLE DELAY ELEMENT

(75) Inventor: Peter H. Voss, Aromas, CA (US)

(73) Assignee: Sand Craft, Inc., Santa Clara, CA (US)

( * ) Notice: Subject to any disclaimer, the term of this patent is extended or adjusted under 35 U.S.C. 154(b) by 0 days.

(21) Appl. No.: 09/562,057

(22) Filed: May 1, 2000

(51) Int. Cl.$^7$ .................................................. H03H 11/26
(52) U.S. Cl. .......................... 327/276; 327/271; 327/281
(58) Field of Search .................................. 327/270, 271, 327/276, 277, 278, 281, 284, 288, 393, 394, 395, 396, 399, 400, 401

(56) References Cited

U.S. PATENT DOCUMENTS 5,365,204 * 11/1994 Angiulli et al. ......................... 331/57
6,163,194 * 12/2000 Truong et al. ......................... 327/259

* cited by examiner

*Primary Examiner*—Toan Tran
*Assistant Examiner*—Cassandra Cox
(74) *Attorney, Agent, or Firm*—Fernandez & Associates, LLP

(57) ABSTRACT

The invention is to provide a programmable delay element that can produce a variable delay with many different delay combinations. The invention creates a variable delay through logic gates. A plurality of transmission gates are used to transfer a signal through a plurality of fixed delay lines. Four parallel coupled signal paths, each path having a fixed delay, form the basis of the invention. By selecting a path or by serially adding successive paths, the desired delay of the signal present on the delay line can be achieved.

8 Claims, 3 Drawing Sheets

DIGITAL PROGRAMMABLE DELAY ELEMENT

FIELD OF INVENTION

This invention relates to delay lines and more particularly to programmable delay lines.

BACKGROUND OF INVENTION

As manufacturing of an integrated circuit becomes highly dense with numerous parasitic effects, it is increasingly difficult to determine a chip behavior from simulation. Build-in delay elements are used in a VLSI chip as a viable alternative for adjusting timing discrepancies. FIG. 1A schematically shows a typical circuit of a delay element according to the prior art. Transfer devices D1 101, D2 102, D3 103, D4 104 each have a controlled current path from the delay line 110 through a serially connected fixed value capacitor, C 105, 2C 106, 4C 107 or 8C 108, to ground respectively. In operation, when a transfer device is selectively turned on, current flows from the input line through the transfer device and then through the serially connected fixed value capacitor to ground. The resistive load ($R_L$) present on the delay line in conjunction with the capacitance of the fixed capacitor form an RC circuit having a time constant (T) equal to $T=R_L*C$. By turning on more than one transfer device, parallel capacitance is added thereby increasing the time constant.

The delay of the signal present on the delay line is increased as more parallel capacitance is added. This function is graphically shown in FIG. 1B where the rise time of the signal propagating through the delay line increases as capacitance is increased. A conventional solution does not allow for altering the delay in fix time intervals due to changing nature of a transistor's resistance. Accordingly, it is desirable to provide a programmable delay element that can provide a delay with many available delay combinations.

SUMMARY OF INVENTION

The invention is to provide a programmable delay element that can produce a variable delay with many different delay combinations. The invention creates a variable delay through logic gates. A plurality of transmission gates are used to transfer a signal through a plurality of fixed delay lines. Four parallel coupled signal paths, each path having a fixed delay, form the basis of the invention. By selecting a path or by serially adding successive paths, the desired delay of the signal present on the delay line can be achieved.

DETAILED DESCRIPTION OF PREFERRED EMBODIMENT(S)

Figure 1A:
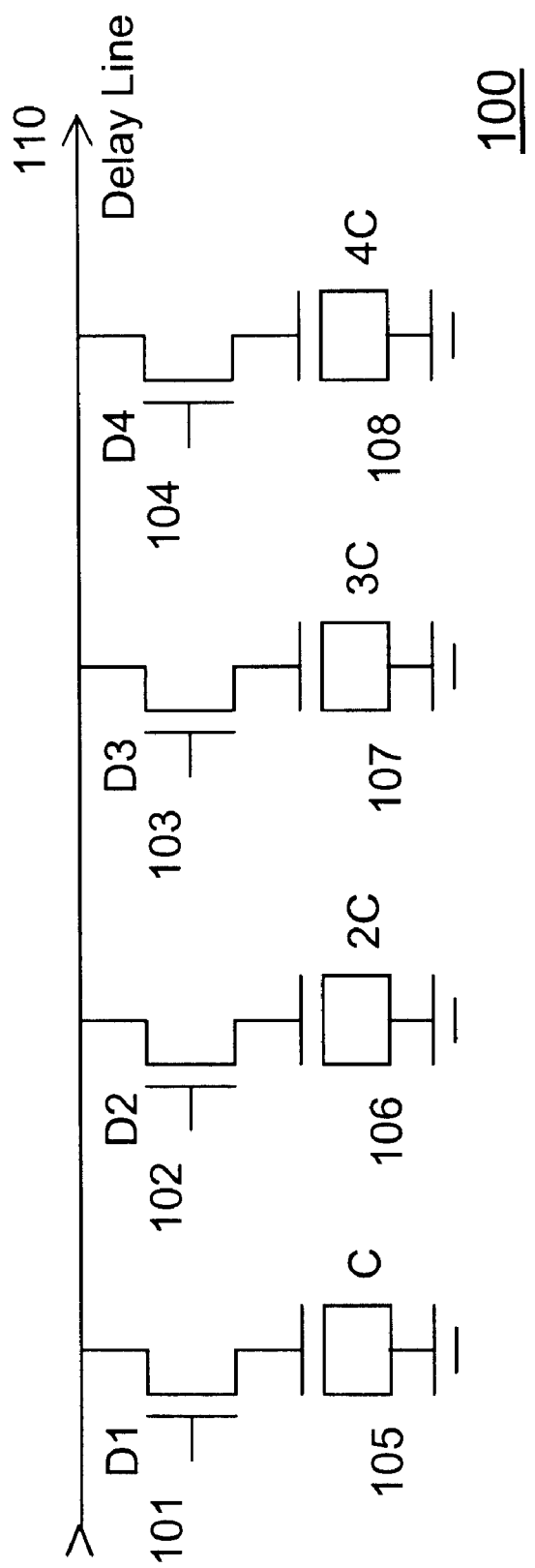
FIG 1A a prior art circuit diagram illustrating a line delay circuit.
Figure 1B:
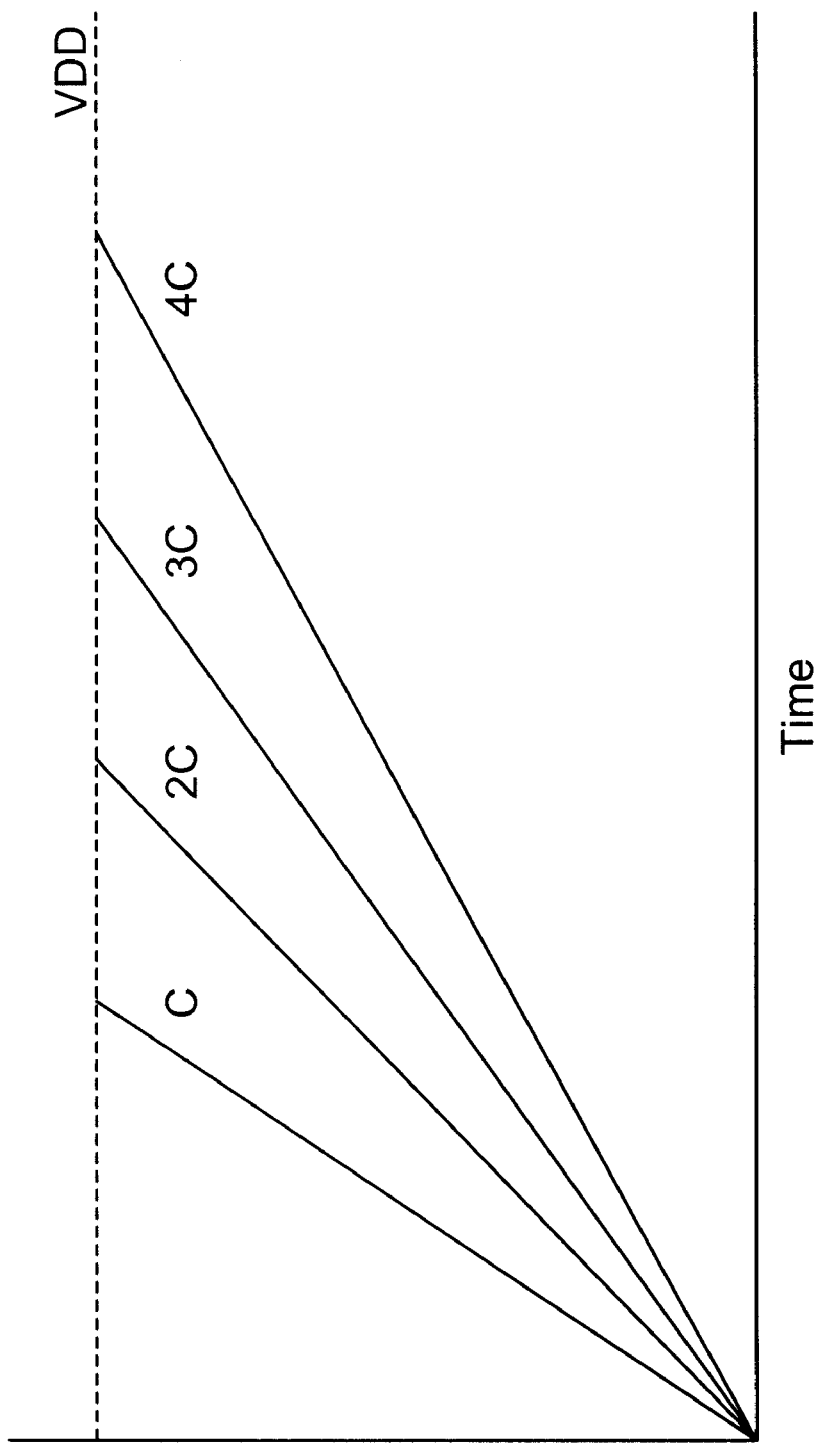
FIG. 1B is a graph depicting time constant curves representing the varying rise times a signal in the prior art line delay circuit.
Figure 2:
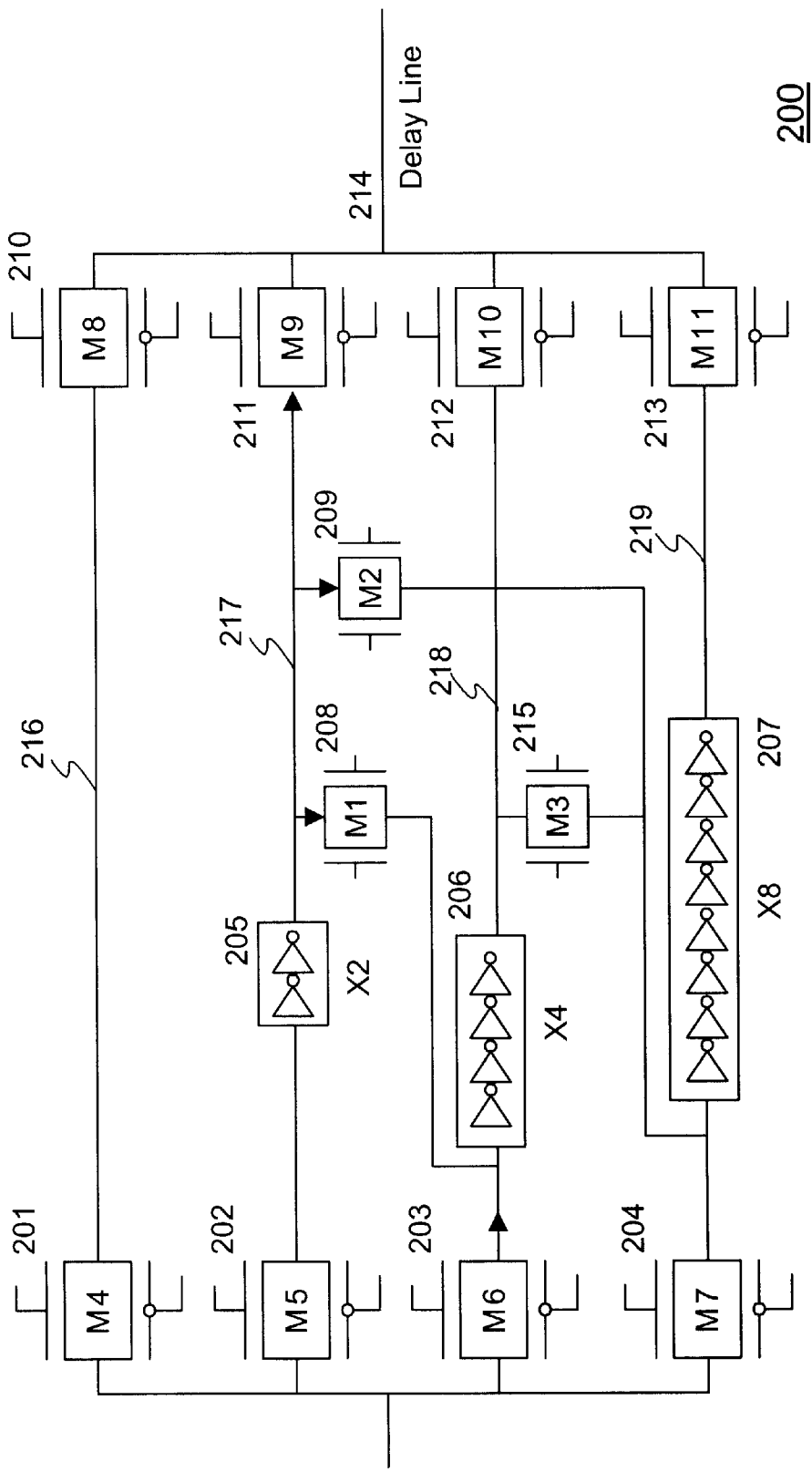
FIG. 2 is a circuit diagram illustrating a programmable line delay in accordance with the present invention.

FIG. 2 is a circuit diagram illustrating a programmable line delay circuit 200 in accordance with the invention. The programmable line delay circuit 200 comprises delay elements X2 205, X4 206, and X8 207 connected in parallel, each delay element having and input and output path. Although the delay element as shown contains inverter circuits, each inverter circuit having a fixed propagation delay factor. It is apparent to one of ordinary skilled in the art that any type of delay element may be used and is contemplated in the invention. Although FIG. 2 depicts a programmable delay line 200 with delay elements progressively increasing by a power of two, it is to be understood that the specific arrangement of the delay elements may be in any order and may even be interlaced. Moreover, the multiple delay elements can be arranged where one delay element is n multiple time of another delay element, where n is an integer number.

In one embodiment, a number of input transmission gates are serially connected with one another, M4 201, M5 202, M6 203, M7 204, and a number of output transmission gates are serially connected with M8 210, M9 211, M10 212 and M11 213. In between each input transmission gate and each output transmission gate, there is a delay line connected between an input transmission gate and an output transmission gate. The delay lines are structured in this embodiment with no delay line 216, an X2 delay line 271, an X4 delay line, and an X8 delay line. More specifically, delay line 216 is coupled between input transmission gate 201 and output transmission gate 210. Delay line 217 is coupled between input transmission gate 202 and output transmission gate 211. Delay line 218 is coupled between input transmission gate 203 and output transmission gate 212. Delay line 219 is coupled between input transmission gate 204 and output transmission gate 213. Delay circuit 200 produces a delay line output 214 from among one of the delay lines 216, 217, 218, or 219.

Cascading of delay lines 217, 218, and 219 are routed via intermediate transmission gate 208, 209, and 215. Between delay line 217 and 218, intermediate transmission gate 208 routes the X2 delay 205 to an input of X4 delay 206 to generate a total of X6 (X2+X4) delays on delay line 218. Between delay line 217 and delay line 219, intermediate transmission gate 209 routes X2 delay 205 back to an input of X8 delay 207 on delay line 219 to produce a total of X10 (X2+X8) delays on delay line 219. If a greater amount of delay is desired, intermediate transmission gate 215 is further feedback the delay from delay line 218 to an input of X8 delay 207 to generate a total delay of X14 (X2+X4, and X8).

In operation, to create a delay of X14 (X2+X4,+X8), gates M5 202, M1 208, M3 215 and M11 213 would be turned on. The signal path would then be through buffer X2 205, buffer X4 206 and buffer X8 209. The delay would be the simple addition of the delay factor found in each buffer.

As can be seen, by turning on the appropriate transmission gates, the amount of delay present on the delay line can be varied with great flexibility.

The above embodiments are only illustrative of the principles of this invention and are not intended to limit the invention to the particular embodiments described. For example, the delay circuit 200 is intended as one implementation in illustrating programmable delays with intermediate transmission gates. One of ordinary skilled in the art should recognize that various odd or even combinations can be formed by intermediate transmission gates to provide the delay circuit with a range of delays that are differ consecutively, multiples, exponentials, or other types of mathematical relationship between a group of delay elements. Accordingly, various modifications, adaptations, and combinations of various features of the described embodi-

What is claimed is:

1. A programmable delay line circuit comprising:

a plurality of delay elements each having a fixed delay, each delay element having an input and output terminal;

a first set of transmission gates, each transmission gate having a controlled current path and a control terminal, the inputs of the controlled current paths are coupled together to form the input to the delay line circuit, the outputs of each controlled current path are coupled separately to the input of one of the delay elements; and a second set of transmission gates, each transmission gate having a controlled current path and a control terminal, the outputs of the controlled current paths are coupled together to form the output of the delay line circuit, the inputs of each controlled current path are coupled separately to the output of one of the delay elements; and a third set of transmission gates, each transmission gate having a controlled current path and a control terminal, the input of each controlled current path is coupled to the output of a separate delay element, the output of each controlled current path is coupled to the input of another separate delay element;

wherein one or more delay elements may be selected by turning on a first, second and third transmission gate.

2. A method of delaying a signal along a line using a programmable delay device, the delay device comprising: a plurality of delay elements, each delay element having an input and output terminal, each delay element providing a fixed and separate amount of delay; a first, second and third set of transmission gates, each transmission gate having a controlled current path and a control terminal, the inputs of the first set of transmission gates are coupled together, the outputs of the first set of transmission gates are separately coupled to the input of a delay element, the output of a delay element is coupled to the input of a separate second set transmission gate, the outputs of the second set of transmission gates are connected together, the inputs of the third set of transmission gates are separately coupled to the output of a separate delay element, the outputs of the third set of transmission gates are coupled separately to the input of a separate delay element; the method comprising:

enabling two or more transmission gates to form a connected path from the input terminal to the output terminal, thereby choosing a single delay element or a series of delay elements.

3. A circuit, comprising:

a first delay element having a first amount of delay on a first delay line;

a second delay element having a second amount of delay on a second delay line; and at least one intermediate transmission gate, coupled between the first delay element and the second delay element, for feeding back the delay from the first delay element to the second delay element, and for generating a total output delay that is a sum of the first delay and the second delay.

4. A circuit of claim 3, further comprising a first input transmission gate connected to the first delay line.

5. A circuit of claim 3, further comprising a second input transmission gate connected to the second delay line.

6. A circuit of claim 3, further comprising a first output transmission gate connected to the first delay line.

7. A circuit of claim 3, further comprising a second output transmission gate connected to the second delay line.

8. A circuit of claim 3, further comprising a load coupled in parallel to the at least one intermediate transmission gate for balancing the loading.

* * * * *